United States Patent [19]

Mori et al.

[11] Patent Number: 5,162,241
[45] Date of Patent: Nov. 10, 1992

[54] METHOD OF MANUFACTURING A SEMICONDUCTOR DEVICE

[75] Inventors: Kunihiro Mori, Yokosuka; Katsuya Okumura, Yokohama, both of Japan

[73] Assignee: Kabushiki Kaisha Toshiba, Kawasaki, Japan

[21] Appl. No.: 725,568

[22] Filed: Jul. 3, 1991

[30] Foreign Application Priority Data

Jul. 5, 1990 [JP] Japan ............................ 2-176302
Feb. 18, 1991 [JP] Japan ............................ 3-78686

[51] Int. Cl.⁵ .................................... H01L 21/306
[52] U.S. Cl. ............................... 437/10; 437/11; 437/12; 437/974; 148/DIG. 60; 148/DIG. 135
[58] Field of Search .............. 437/10, 11, 12, 13, 437/974, 228; 148/DIG. 60, 61, DIG. 135

[56] References Cited

U.S. PATENT DOCUMENTS

| | | | |
|---|---|---|---|
| 4,144,099 | 3/1979 | Edmonds et al. | 437/10 |
| 4,220,483 | 9/1980 | Cazcarra | 437/10 |
| 4,276,114 | 6/1981 | Takano et al. | 437/10 |
| 4,314,595 | 2/1982 | Yamamoto et al. | 437/10 |
| 4,410,395 | 10/1983 | Weaver et al. | 156/645 |
| 4,659,400 | 4/1987 | Garbis et al. | 437/12 |
| 4,851,358 | 7/1989 | Huber | 437/10 |
| 5,006,475 | 4/1991 | Robbins et al. | 148/DIG. 60 |

FOREIGN PATENT DOCUMENTS 61-42911 3/1986 Japan .
1-184834 7/1989 Japan .

OTHER PUBLICATIONS

Silicon Processing for the VLSI Era; vol. 1; Wolf et al.; 1986; pp. 61-70.

*Primary Examiner*—Brian E. Hearn
*Assistant Examiner*—Michael Trinh
*Attorney, Agent, or Firm*—Finnegan, Henderson, Farabow, Garrett and Dunner

[57] ABSTRACT

A gettering site is formed on the backside of a wafer, contaminant impurities are trapped in the gettering site by heat treatment, a contaminated layer of the gettering site including the impurities is removed. The impurities are thus prevented from being freed from the gettering site into the wafer. A new gettering site is then formed on the backside of the wafer. Such a gettering operation has therefore a refresh function.

14 Claims, 6 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device which is particularly applied to a gettering technique for removing contamination of metal such as heavy metal.

2. Description of the Related Art

High degree of integration and miniaturization of semiconductor devices lately tend to increase the number and kind of steps and facilities for manufacturing the semiconductor devices and accordingly semiconductor wafers are susceptible to contamination of metal such as Fe and Cu during the manufacture of the semiconductor devices. It is well known that the contamination in a depletion layer of PN junction causes a recombination current (hereinafter referred to as g-r current) which degrades electric characteristics of the semiconductor devices. The contamination particularly affects significant characteristics such as pause characteristics (charge retaining characteristics) of a dynamic random-access memory (DRAM) and, even though the contamination is less, it will become a serious problem in accordance with miniaturization of devices having a memory capacity of 16 M bits or more. The problem of contamination will be more and more serious. It is of course necessary that an influence of the contamination on not only the memory but also other devices be taken into consideration. For example, if a contaminant such as Fe is included in a silicon semiconductor substrate on which a charge coupled device (CCD) image sensor is formed, the contaminant is trapped and fixed in a defective lattice of a semiconductor wafer which is caused by ion-implantation after the wafer is annealed. When a region near a photo diode of the CCD image sensor in which the contaminant is fixed, is depleted, the contaminant is the main cause to generate electric charges and appears as a minute white stain (defective image which is whitely formed on a screen). The contaminant such as Fe and Cu causes the minute white stain to be generated. Although a reduction in the contaminant has been tried in respective manufacturing steps, the contaminant cannot perfectly be eliminated. It is thus necessary to use a gettering technique wherein the contaminant included in the wafer is effectively trapped in a region other than the active region of a semiconductor element.

The conventional gettering technique includes extrinsic gettering in which the backside of a wafer is damaged or distorted to getter impurities and intrinsic gettering in which small nuclei are formed by interstitial oxygen of a wafer and impurities are caught by the nuclei.

The following four methods can be used for the extrinsic gettering.

(1) The backside of the wafer is mechanically damaged or distorted by the honing technique using an $SiO_2$ powder. It is the most common to use a backside-damaged wafer in which the damage or distortion is applied before the wafer is formed.

(2) The backside of the wafer is damaged or distorted by ion implantation or laser irradiation.

(3) Phosphorus is diffused into the backside of the wafer from a diffusion source such as PSG, $POCl_3$, and phosphine formed on the backside thereof. (A gettering site is formed on the backside of the wafer by causing a misfit dislocation by the phosphorus.)

(4) A film is formed to cause elastic distortion.

The extrinsic gettering however has a drawback wherein the wafer is annealed by high-temperature heat treatment after the gettering and a function of the gettering site is reduced to half or lost. It is the latest mainstream that complementary MOS (CMOS) devices are used as semiconductor devices of low power consumption. It is well known that in the CMOS devices the gettering effect of the backside damage wafer is almost lost after a well is formed by heat treatment at about 1200° C. Both the extrinsic and intrinsic gettering has a drawback wherein the contaminant trapped in the gettering site is easily freed therefrom by the heat treatment subsequent to the gettering and then diffused into an element active region on the surface of the wafer to thereby reduce the gettering effect to half.

SUMMARY OF THE INVENTION

It is accordingly an object of the present invention to provide a method of manufacturing a semiconductor device using a new gettering technique which prevents a gettering effect from being reduced to half or lost by heat treatment.

A method of manufacturing a semiconductor device according to the present invention comprises:

a first step of forming a gettering site on a backside of a semiconductor wafer;

a second step of subjecting the semiconductor wafer to a heat treatment to trap contaminant impurities in the gettering site; and a third step of removing a contaminated layer of the gettering site in which the contaminant impurities are trapped, the first, second and third steps constituting one cycle, and the one cycle being repeated at least twice.

The gettering site is formed by techniques of grinding using abrasive grains, honing using $SiO_2$ powder, ion implantation, laser irradiation, phosphorus diffusing, and film forming, either alone or in combination. When the phosphorus diffusing technique is used, the above first and second steps are executed by the same heat treatment and phosphorus is diffused at 800° to 1000° C. to form the gettering site. If the gettering site includes a damaged layer, the heat treatment can be performed in an atmosphere containing the phosphorus. Further, the gettering site is formed with the surface of the wafer unexposed.

The heat treatment for trapping the contaminant impurities in the gettering site can be replaced with other heat treatments in the steps of manufacturing the semiconductor device. At least one heat treatment or all heat treatments can be performed at 700° C. or more. Further, the heat treatment can be replaced with heat treatment or heat treatments for forming a well and/or a field oxide film. The gettering site can be formed on the backside of the wafer before FG sintering and can be removed after the FG sintering, together with the trapped impurities.

The contaminated layer is removed by mechanical grinding and, at the same time, a new gettering site is formed by the mechanical grinding. The size of abrasive used for removing the contaminated layer can be caused to differ from that of abrasive used for forming the gettering site. The gettering site can be used if its thickness is 2 μm or less.

In the present invention, after the gettering site is formed on the backside of the wafer and the impurities are trapped in the gettering site by heat treatment, the impurities are removed together with the gettering site serving as the contaminated layer, to prevent the impurities from being freed from the gettering site. A new gettering site is then formed on the backside of the wafer. The gettering of the present invention thus includes a refresh operation. If the refresh operation is repeated plural times when the gettering cannot be performed for a long time at high temperature because of miniaturization of semiconductor elements, the present invention produces the effect which cannot be obtained from one gettering operation and has the advantage of performing the gettering operation for a short time at relatively low temperature.

A semiconductor device is manufactured mainly through a wafer manufacture process, a wafer treatment process, and an assembly process. According to the conventional gettering technique, there is a case where a gettering site is formed during the wafer treatment process, the wafer is thermally treated, and the gettering site is removed by 2 μm at most at the same time when the backside of the wafer is ground (for example, a wafer having a thickness of about 600 μm is ground by about 150 μm). The conventional gettering technique does not aim at positively removing the gettering site, i.e., the contaminated layer. The backside of the wafer is ground to uniform the thickness of the wafer. Assume that the above-described first and second steps are defined as one cycle. When the cycle is repeated at least two or more times, the third step of removing the contaminated layer can be replaced with a grinding process before the assembly process. In other words, the process of removing the contaminated layer in the first cycle cannot be replaced with the grinding process before the assembly process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described with reference to FIGS. 1 to 7. A grinding method for forming a damaged layer on the backside of a wafer will be described first.

Figure 2:
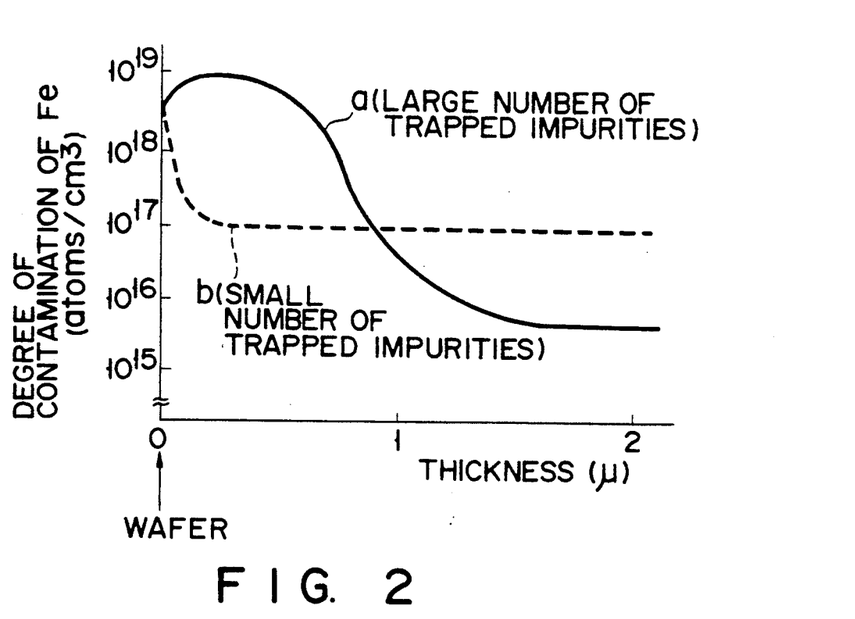
FIG. 2 is a graph showing a gettering effect of forced contaminant Fe, which is obtained by grinding the backside of a wafer.

The backside of a P-type (100) silicon wafer is ground by a grinder having abrasive grains thereon, whose diameter is 10 to 15 μm, to form a damaged layer serving as a gettering site. The wafer is dipped into a contaminated solution containing Fe of 100 ppm and undergoes heat treatment for an hour at 1000° C. in an atmosphere of $N_2$. Therefore, the wafer is forcibly contaminated with Fe. FIG. 2 shows an effect obtained by measuring a degree of contamination of Fe, which progresses in the thickness direction of the wafer from the backside of the wafer, using secondary ion mass spectrometry. In FIG. 2, the ordinates show the degree of contamination of Fe (atoms/cm$^3$), and the abscissas show the thickness (μm) of the wafer from its backside. In FIG. 2, a solid line a indicates an amount of impurity Fe trapped in the damaged layer by the heat treatment, and a broken line b indicates an amount of impurity Fe trapped by the heat treatment without forming a damaged layer on the backside of the wafer. As is apparent from FIG. 2, Fe is effectively trapped in the gettering site on the backside of the wafer within a 1.5 μm in thickness, and the amount of Fe in bulk of the wafer is set so as not to exceed a detection limit ($<7 \times 10^{15}$ atoms/cm$^3$).

Figure 1A:
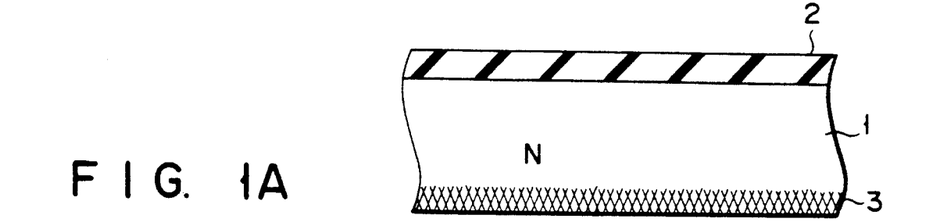
FIGS 1A to 1I are cross-sectional views showing a method of manufacturing a semiconductor device according to an embodiment of the present invention.
Figure 1B:
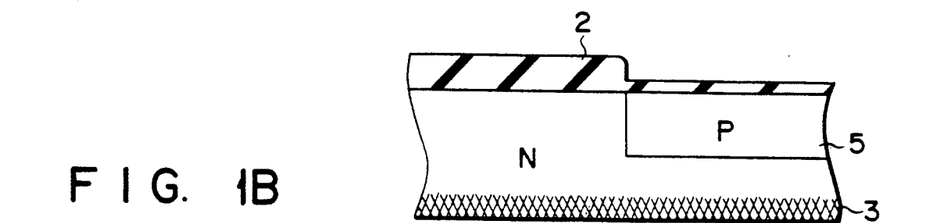
Figure 1C:
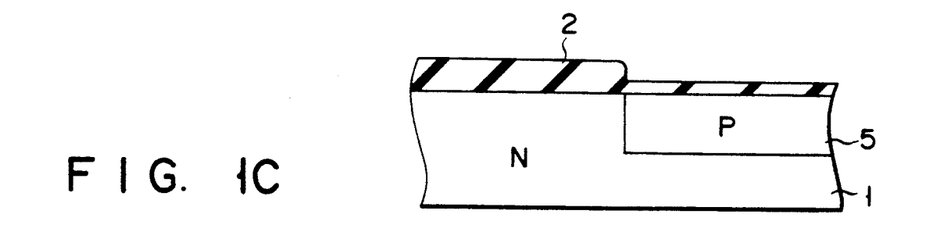

An embodiment in which a method of manufacturing a semiconductor device according to the present invention is applied to a test element group (TEG) having a CMOS structure, will be described with reference to FIGS. 1A to 1I. As illustrated in FIG. 1A, a thermal oxide film 2 having a thickness of 100 Å is formed on an N-type (100) silicon substrate (wafer) 1 whose specific resistance ρ is about 3 Ω cm and then a gettering site 3 of a damaged layer is formed on the backside of the wafer by the above-described grinding technique. A portion of the thermal oxide film 2 is etched off to form a P well forming region and boron is ion-implanted therein at an acceleration energy of 100 KeV and a dose of $3 \times 10^{12}$ cm$^2$. A P well 5 is thus formed through the drive-in step under the conditions that temperature is 1190° C., atmosphere is $N_2 + O_2$, and time is 8 hours (FIG. 1B). Contaminant impurities are trapped in the gettering site 3 and accordingly the gettering site serves as a contaminated layer 3. The contaminated layer 3 is then ground by the grinder having abrasives each having a diameter of 1 to 2 μ and removed (FIG. 1C).

Figure 1D:
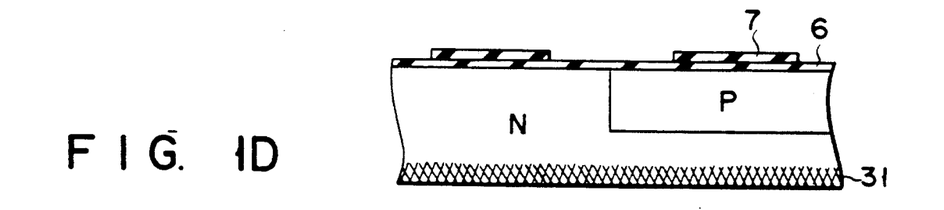
Figure 1E:
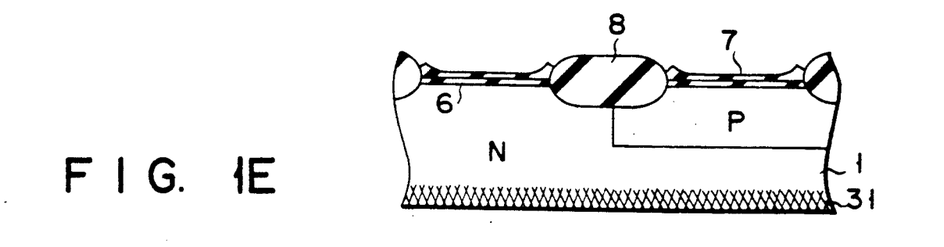
Figure 1F:
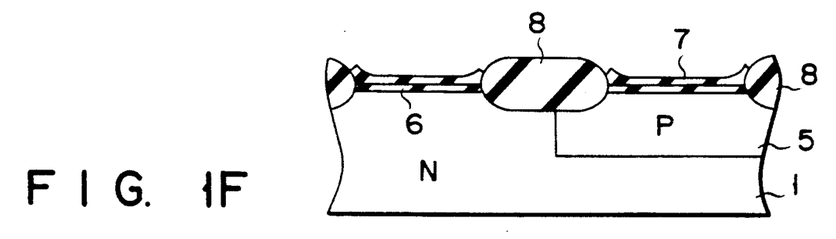

A field oxide film is formed as follows by local oxidation of silicon (LOCOS). The thermal oxide film 2 is all etched off to form a thermal oxide film 6 of 1000 Å in thickness on the wafer 1. An $Si_3N_4$ film 7 of 2000 Å in thickness is formed on the thermal oxide film 6 by low pressure chemical vapor deposition (LPCVD). The $Si_3N_4$ film 7 is etched to leave the film 7 in an element region only. A gettering site 31 is formed again on the backside of the wafer by the grinding technique (FIG. 1D). After that, the wafer 1 is oxidized for four hours by hydrogen burning oxidation at 1000° C. to form a field oxide film 8 of 8000 Å on the wafer 1 and trap the contaminant impurities in the gettering site 31 (FIG. 1E). The gettering site 31 is thus ground and removed using the grinder (FIG. 1F).

Figure 1G:
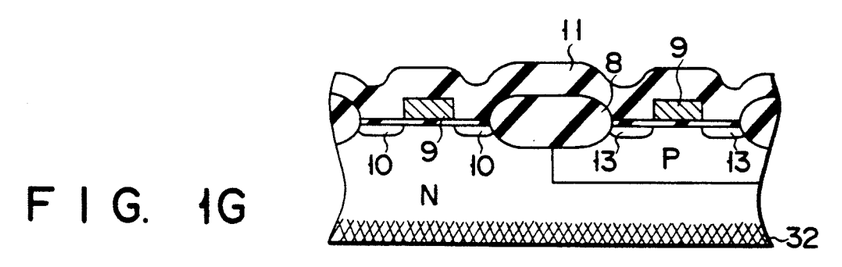
Figure 1H:
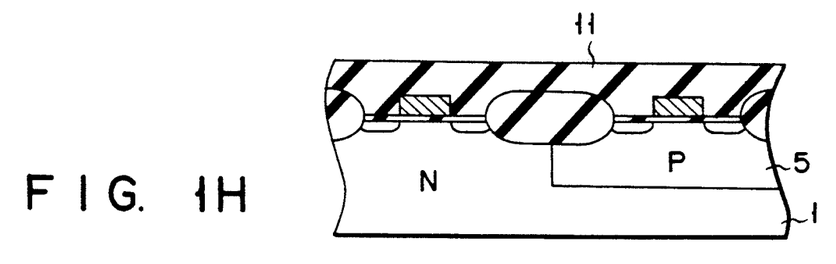
Figure 1I:
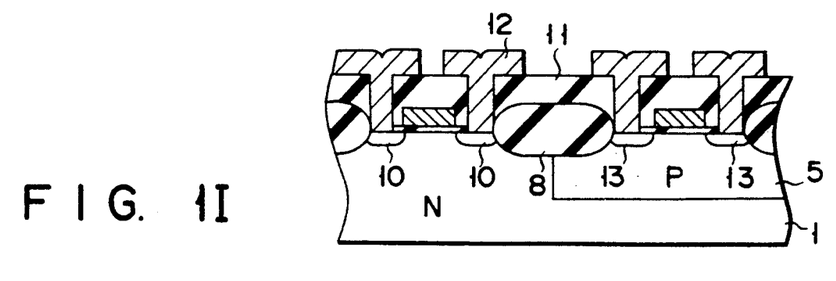

A polysilicon gate electrode 9 is then formed on the thermal oxide film 6 which serves as a gate oxide film between the field oxide films 8. Boron is ion-implanted into an N region of the wafer 1 to form P+ source and drain regions 10. Arsenic is ion-implanted into the P well to form N+ source and drain regions 13. Using normal pressure CVD, an undoped CVD $SiO_2$ film of 1500 Å, a BPSG film of 8000 Å, and a PSG film of 1500 Å are sequentially deposited one after another, thereby forming an interlayer insulation film 11 having a thickness of 11000 Å (FIG. 1G). A gettering site 32 is then formed on the backside of the wafer by the grinding technique. The interlayer insulation film 11 is flattened by $POCl_3$ diffusion for 60 minutes at 900° C. and at the same time the contaminant impurities are trapped in the gettering site 32. The gettering site is thus ground and removed using the grinder (FIG. 1H). Contact holes are formed in the interlayer insulation film 11 on the source and drain regions and Al-Si-Cu electrodes 12 are formed therein (FIG. 1I). Next, forming gas (FG) sintering is executed at 450° C. in an atmosphere of hydrogen of 10 volume % and nitrogen of 90 volume %, and electric characteristics are then evaluated.

Figure 3:
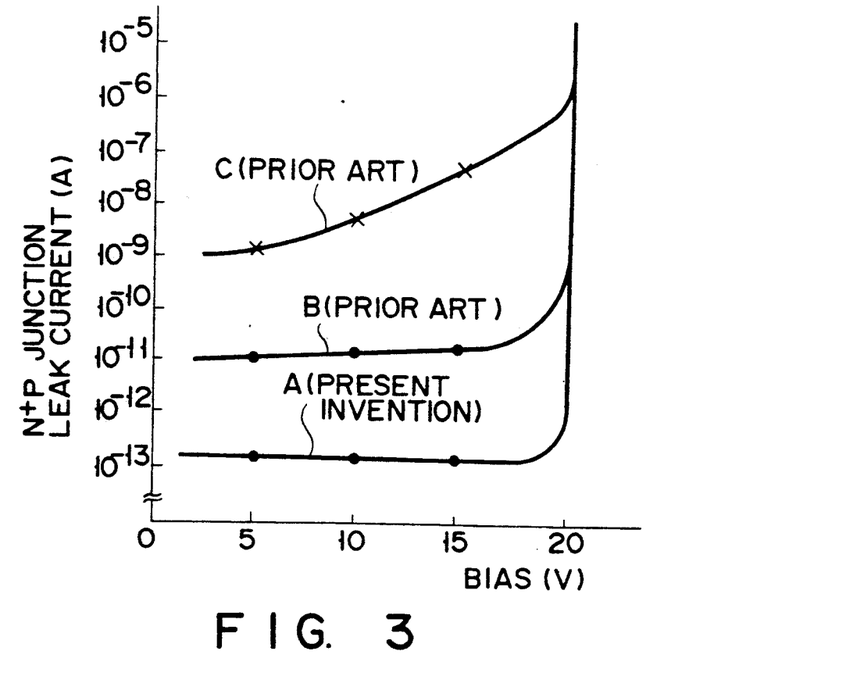
FIG. 3 is a graph showing leak currents of diodes of the present invention and prior art.

Leak characteristics (reverse bias) in a junction between the N+-P well and P+-N substrate formed by the method shown in FIGS. 1A to 1I. FIG. 3 represents data of leak characteristics of a diode having a junction of 0.2 mm² with the N+-P well. In the present invention, almost all elements have the characteristics indicated by curve A. In the prior art which does not have the process of grinding the backside of a wafer, about 70% diodes have the characteristics indicated by curve B and about 30% diodes have the characteristics shown by curve C. As a result, the present invention allows metal impurities to be effectively trapped and removed, and the g-r currents mainly having the impurities are reduced to 1/100 or less.

As is evident from the above, it is desirable to form a gettering site with the surface of the wafer unexposed. If the surface is exposed, the contaminant impurities intrudes into the wafer and thus the gettering operation cannot effectively be performed. As the contaminant impurities, there are Au, Cr, Co, Ni, etc. as well as Fe and Cu. In the present invention, the gettering operation can efficiently be performed using a heat treatment in the process of treating the wafer rather than using a heat treatment exclusively for the gettering operation. The gettering operation becomes more effective if a high-temperature heat treatment of 700° C. or more is carried out at least once. If all the heat treatments of the present invention are performed at high temperature, the wafer, which is greatly contaminated with the impurities, can be easily treated.

When the present invention is applied to a 4-Mbit DRAM device, the pause yield (no redundancy), which was 70 to 80% in the prior art, has rapidly been improved to have a value of 99% or more. If the present invention is applied to other devices such as CCD image sensors, a minute white stain as described above will not be generated.

In the embodiment of the present invention, the gettering site is formed using the grinding technique. The present invention is not limited to the embodiment. The gettering site can be mechanically formed by spraying fine grains such as dry ice on the backside of the wafer or by the honing method in which $SiO_2$ powder is sprayed on the backside of the wafer. Furthermore, it can be formed by ion-implantation or laser irradiation.

According to the ion-implantation, Ar, O, P or the like is ion-implanted into the backside of the wafer, a lattice is damaged and distorted by the ion-implantation, and heavy metal is trapped in the distorted lattice. The ion-implantation is used to form the damaged layer 3 on the backside of the N-type silicon substrate 1 whose surface is covered with the thermal oxide film 2 as shown in FIG. 1. The Ar is ion-implanted into the backside of the wafer under the conditions of acceleration voltage of 150 KeV and dose of $1 \times 10^{16}/cm^2$ and then the gettering operation is performed at 900° C. for half an hour to trap the impurities in the gettering site.

According to the laser irradiation, the backside of the wafer is irradiated with a laser beam to cause defects. The laser beam melts a portion of the backside of the wafer and, when the melted portion is solidified, dislocations or point defects are caused, resulting in a gettering effect.

The gettering site can also be formed using the above-described phosphorus diffusing technique. According to this technique, high-concentration phosphorus is diffused into the backside of the wafer to trap impurities in a diffusing layer or a diffusing source layer. The gettering technique using the phosphorus diffusing technique is called "phosphorus getter." The "phosphorus getter" is performed by diffusing phosphorus into the backside of the wafer from the source such as PSG, $POCl_3$, phosphine ($PH_3$) at high temperature of about 800 to 1000° C. and can be used before and during the process of manufacturing elements. A portion of the diffusing layer into which the phosphorus is diffused beyond the limit of solid solubility of phosphorus at the gettering temperature, serves as an effective gettering site. Assuming that the thickness of the diffusing layer is that of the gettering site, it is 1 μm when the phosphorus is diffused at 1000° C., 0.2 μm when at 900° C., and 0.1 μm or less when at 800° C. In the "phosphorus getter," too, the above-described three steps are executed as one cycle. More specifically, a high-concentration phosphorus diffusing layer serving as a gettering site is formed, then contaminant impurities are trapped in the gettering site by heat treatment, and finally the gettering site is removed. Heat treatment for forming the high-concentration phosphorus diffusing layer can be used for the heat treatment for the gettering operation and, in this case, the two steps are executed at once and thus the steps can be simplified. Furthermore, the gettering effect can be increased by thermally treating the wafer having a gettering site using $POCl_3$ including phosphorus, that is, using both the "phosphorus getter" and the other gettering technique.

The gettering site can also be formed using the film forming technique. If an $Si_3N_4$ film or a polysilicon film is formed on the backside of a wafer, elastic distortion is induced to form a gettering site. For example, the $Si_3N_4$ film is formed on the backside of the wafer by CVD or sputtering. Stress is applied to the interface between the wafer and $Si_3N_4$ film and contaminant impurities are segregated when the wafer is thermally treated.

In the above embodiment, a normal semiconductor device manufacture process is inserted between the process of removing the contaminated layer obtained by trapping impurities in the damaged layer on the backside of the wafer and that of forming a new damaged layer on the backside of the wafer. The new damaged layer can be formed after the contaminated layer is removed and, in this case, the same device (e.g., grinding device) can be used and the diameter of each abrasive by which the damaged layer is formed can be caused to differ from that of each abrasive by which the contaminated layer is ground. In the above embodiment using the grinding technique, the gettering is performed at a heat treatment temperature of 900° C. or more. A lower heat treatment temperature can be selected. For example, a gettering site can be formed on the backside of a wafer before the FG sintering at 450° C. and, after the sintering, impurities trapped in the gettering site can be removed. Of course, the heat treatment exclusively for the gettering can be used without substituting a heat treatment of the manufacturing process.

Figure 4:
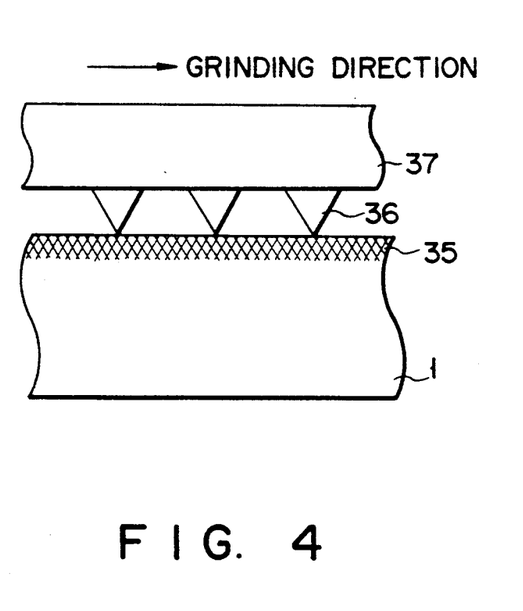
FIG. 4 is a view for explaining a method for forming a damaged layer on the backside of the wafer by the grinding.
Figure 5:
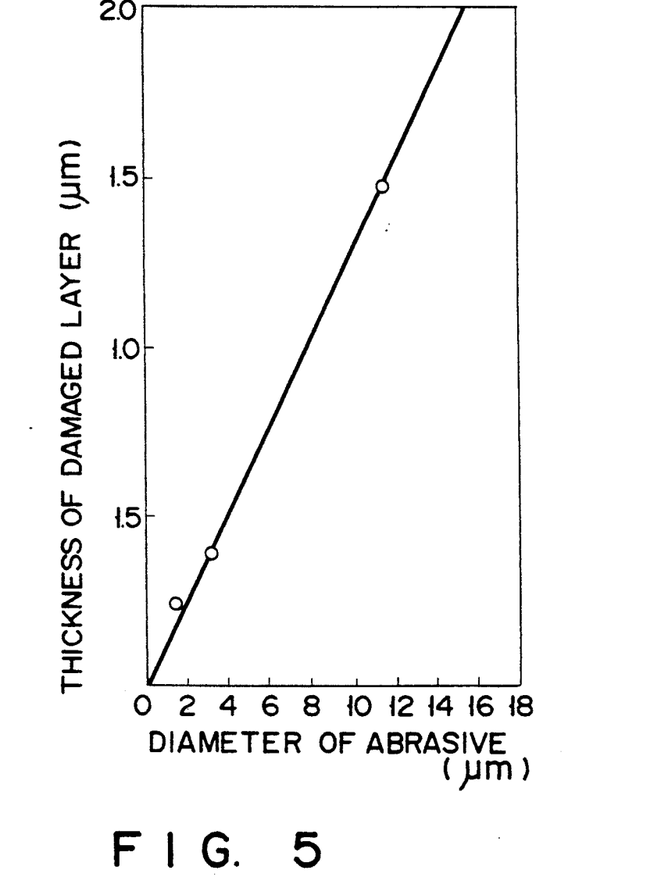
FIG. 5 is a graph showing a relationship between the diameter of abrasive grain and the thickness of a ground layer on the backside of the wafer.

FIG. 4 is a view for explaining a method of forming a damaged layer 35 serving as a gettering site on the backside of the wafer 1 by the grinding technique. The damaged layer 35 is formed by a grinding device including a grinder 37 having fine abrasives 36. FIG. 5 is a graph showing the relationship between the diameter (abscissa) of each abrasive and the thickness (ordinate) of the damaged layer formed by each abrasive. The damaged layer is formed to have a thickness of about 0.2 to 2 $\mu$m. Since the thickness of the damaged layer is proportionate to the diameter of each abrasive, it is adjusted in accordance with the kind of grinder. The thickness of the damaged layer depends upon the amount of impurity to be trapped therein. A high degree of integration of semiconductor devices greatly demands miniaturization of semiconductor elements, so that the gettering cannot be performed at a high temperature or for a long time. If the present invention is applied in this situation, the impurities can effectively be removed without requiring a high temperature or a long time. If the thickness of the gettering site is set to be 0.1 $\mu$m or less and the number of cycles is increased, a small number of impurities, which affect the electric characteristics of the semiconductor devices, can reliably be removed. The diameter of each abrasive used to form the damaged layer is about 1 to 15 $\mu$m as is apparent from FIG. 5. Since, however, the diameter of each abrasive used to remove the contaminated layer is 1 to 2 $\mu$m as in the above embodiment, even if both the steps of forming the damaged layer and removing the contaminated layer are executed by the same device, the diameters of the abrasives used in these steps must be caused to differ from each other. In the present invention, the thickness of the damaged layer is not limited to the range described above. The thickness can be 1.5 $\mu$m or more, or 0.1 $\mu$m or less. (In FIGS. 1A to 1I, a damaged layer having a thickness of almost 2 $\mu$m is formed using an abrasive having a diameter of 15 $\mu$m. The thickness of the damaged layer depends upon how much the semiconductor wafer is contaminated with impurities.

Figure 6:
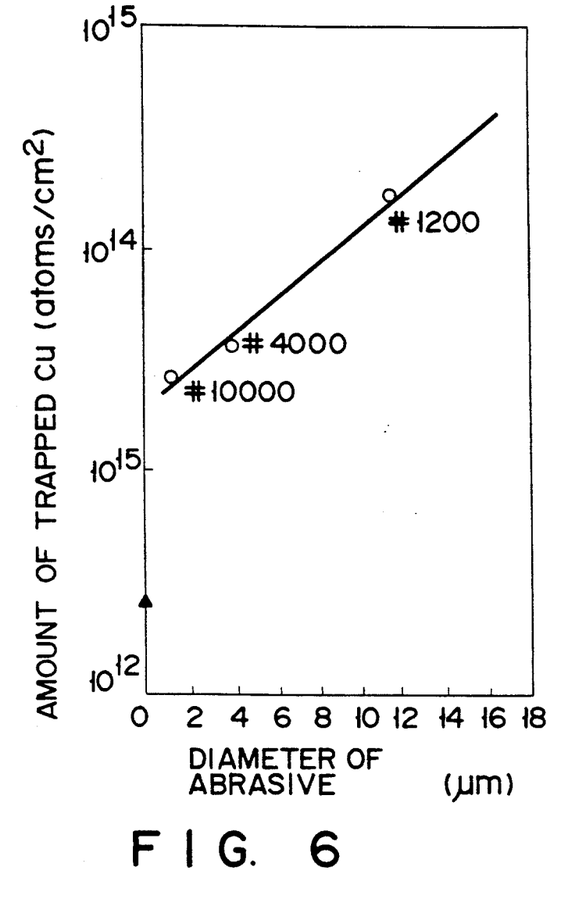
FIG. 6 is a graph showing a relationship between the diameter of abrasive grain and the amount of Cu trapped in the ground layer.

FIG. 6 is a graph showing the relationship between the diameter (abscissa) of each abrasive and the amount (ordinate) of impurity Cu trapped in the damaged layer. The Cu is trapped by the heat treatment for one hour at 1000° C. in an atmosphere of $N_2$. Since the diameter of each abrasive is proportionate to the thickness of the damaged layer as illustrated in FIG. 5, if the conditions of the heat treatment are fixed, the amount of Cu trapped in the damaged layer increases as the damaged layer becomes thicker. As shown in FIG. 6, the grinders used in the above embodiment have grinder numbers, #1200, #4000 and #10000, and the diameters of each abrasives are 12 $\mu$m, 4 $\mu$m, and 1-2 $\mu$m, respectively. When the diameters are 12 $\mu$m, 4 $\mu$m, and 1-2 $\mu$m, the thicknesses of their corresponding damaged layers are 1.5 $\mu$m, 0.4 $\mu$m, and 0.2 to 0.3 $\mu$m, respectively, as is apparent from FIG. 5. In this case, the amounts of Cu trapped in the damaged layers are about $2 \times 10^{14}$ atoms/cm$^2$, about $5 \times 10^{13}$ atoms/cm$^2$, and about $3 \times 10^{13}$ atoms/cm$^2$. An amount of impurity depends upon facilities in the respective manufacturing processes. It is thus advisable to form a gettering site to have a minimum essential thickness in accordance with the amount of impurity.

Figure 7:
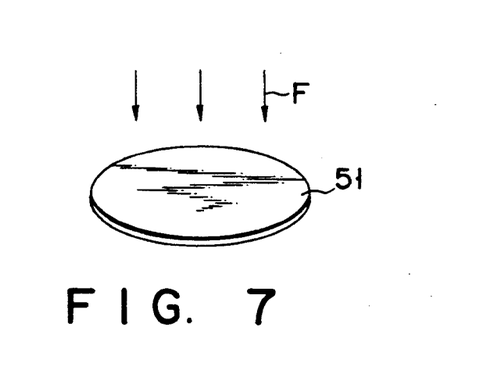
FIG. 7 is a view for explaining a method of forming various gettering sites according to the present invention.

FIG. 7 is a view for explaining a method of forming various gettering sites other than the method of forming a gettering site using the grinding technique. In FIG. 7, reference numeral 51 denotes a wafer, and F indicates fine grains. The fine grains F are $SiO_2$ powder used for the honing technique, ions used for the ion-implantation, laser beams used for the laser irradiation, and phosphorus used for the phosphorus diffusion. When the film forming technique is used, F is a film such as silicon nitride having a high stress. For example, a mixed gas of dichloro-silane and ammonia is used for forming the film. FIG. 7 illustrates the backside of the wafer 51.

The above-described method according to the present invention can be applied to all conventional semiconductor devices. It can be applied to not only the DRAM and CCD but also other memories such as a SRAM (static RAM), a logic circuit, and a hybrid device of the memory and logic circuit. The present invention can also be applied to a device having a memory capacity of 16 M bits or more.

As described above, according to the present invention, the impurities can be trapped by repeating the gettering operation many times, and the electric characteristics such as pause characteristics of memory devices are improved. Furthermore, since the heat treatment used in a manufacturing process can be applied to the gettering operation, yield and reliability of semiconductor devices can be increased.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A method of manufacturing a semiconductor device, characterized by comprising:

a first step of forming a gettering site on a backside of a semiconductor wafer;

a second step of subjecting said semiconductor wafer to a heat treatment to trap contaminant impurities in the gettering site and form a contaminated layer therein; and a third step of entirely removing said contaminated layer of the gettering site in which the contaminant impurities are trapped, thereby preventing the contaminant impurities from permeating the semiconductor wafer, said first, second and third steps constituting one cycle, and said one cycle being repeated at least twice.

2. The method according to claim 1, wherein said gettering site is formed in said first step by using one of a grinding technique using a grinder having abrasive grains, a honing technique using SiO₂ powder, an ion-implanting technique, a laser irradiating technique, a phosphorus diffusing technique, and a film forming technique.

3. The method according to claim 2, wherein, when said phosphorus diffusing technique is used, said first and second steps are executed by a same heat treatment.

4. The method according to claim 2, wherein, when said phosphorus diffusing technique is used, the gettering site is formed at a phosphorus diffusing temperature ranging from 800° to 1000° C.

5. The method according to claim 1, wherein said gettering site is formed of a damaged layer, and said semiconductor wafer is thermally treated in an atmosphere containing phosphorus.

6. The method according to claim 1, wherein said gettering site has a thickness of at most 2 μm.

7. The method according to claim 1, wherein said gettering site is formed with a surface of said semiconductor wafer covered with an insulation film.

8. The method according to claim 1, wherein said heat treatment constitutes and performs another step of manufacturing the semiconductor device.

9. The method according to claim 8, wherein said cycle includes a high-temperature heat treatment at 700° C. or more which is executed at least once.

10. The method according to claim 8, wherein said heat treatment of said another step is performed at a high temperature of 700° C.

11. The method according to claim 8, wherein said heat treatment of said another step includes one or both of heat treatments of steps of forming a well and a field oxide film.

12. The method according to claim 1, wherein said contaminated layer is removed by mechanical grinding.

13. The method according to claim 12, wherein a new gettering site is formed at the same time when said contaminated layer is removed by the mechanical grinding.

14. The method according to claim 13, wherein a diameter of each of abrasives by which said contaminated layer is removed using the mechanical grinding differs from that of each of abrasives by which said gettering site is formed.

* * * * *